US005482918A

United States Patent [19]

Maginnis et al.

[11] Patent Number: 5,482,918

[45] Date of Patent: Jan. 9, 1996

[54] METHOD FOR PRODUCING MICROCOMPOSITE POWDERS USING A SOAP SOLUTION

[75] Inventors: Michael A. Maginnis, Coker; David A. Robinson, Mobile, both of Ala.

[73] Assignee: The United States of America as represented by the Secretary of the Interior, Washington, D.C.

[21] Appl. No.: 192,534

[22] Filed: Feb. 7, 1994

[51] Int. Cl.[6] .......................... H01B 12/00; H01L 39/12

[52] U.S. Cl. .......................... 505/440; 505/100; 505/124; 505/236; 505/238; 505/446; 505/811; 505/734; 252/514; 428/402; 428/403; 428/553; 428/570; 427/125; 427/217

[58] Field of Search .......................... 505/100, 124, 505/236, 238, 440, 446, 734, 811; 252/512, 513, 514, 503; 428/402, 403, 553, 570; 427/125, 217

[56] References Cited

U.S. PATENT DOCUMENTS

| | | | |
|---|---|---|---|
| 4,450,188 | 5/1984 | Kawasumi | 427/217 |
| 4,971,944 | 11/1990 | Charles et al. | 505/1 |
| 4,988,673 | 1/1991 | Ferrando | 505/1 |
| 5,091,362 | 2/1992 | Ferrando | 505/1 |
| 5,178,909 | 1/1993 | Hayashi | 427/216 |
| 5,338,507 | 8/1994 | Anderson et al. | 505/470 |

*Primary Examiner*—Paul Lieberman
*Assistant Examiner*—M. Kopec
*Attorney, Agent, or Firm*—E. Philip Koltos

[57] ABSTRACT

A method for producing microcomposite powders for use in superconducting and non-superconducting applications. A particular method to produce microcomposite powders for use in superconducting applications includes the steps of: (a) preparing a solution including ammonium soap; (b) dissolving a preselected amount of a soluble metallic such as silver nitrate in the solution including ammonium soap to form a first solution; (c) adding a primary phase material such as a single phase YBC superconducting material in particle form to the first solution; (d) preparing a second solution formed from a mixture of a weak acid and an alkyl-mono-ether; (e) adding the second solution to the first solution to form a resultant mixture; (f) allowing the resultant mixture to set until the resultant mixture begins to cloud and thicken into a gel precipitating around individual particles of the primary phase material; (g) thereafter drying the resultant mixture to form a YBC superconducting material/silver nitrate precursor powder; and (h) calcining the YBC superconducting material/silver nitrate precursor powder to convert the silver nitrate to silver and thereby form a YBC/silver microcomposite powder wherein the silver is substantially uniformly dispersed in the matrix of the YBC material.

9 Claims, No Drawings

METHOD FOR PRODUCING MICROCOMPOSITE POWDERS USING A SOAP SOLUTION

RIGHTS OF THE GOVERNMENT

The invention described herein may be manufactured and used by or for the Government of the United States of America for governmental purposes without the payment of any royalties thereon or therefor.

BACKGROUND OF THE INVENTION

1. Field of the Invention

The present invention relates generally to a method for producing microcomposite powders and, more particularly, to a method for producing microcomposite powders utilizing a metallorganic solution which itself is formed from an ammonium soap solution.

2. Description of the Prior Art

Presently, the most commonly used methods for producing microcomposite materials, powders or cermets involve mechanically mixing powders of the desired components by ball milling, and thereafter rolling or shaking in either a wet or dry environment. However, it is very difficult to produce a homogeneous sintered product using these methods due in part to differences in size, shape, or density among the various components blended to form the microcomposite materials or powders.

An alternate approach is through the use of microcomposite precursor powders consisting of the desired components or phases. Such powders are capable of producing relatively homogeneous composites using conventional fabrication methods without mechanical mixing. Microcomposite powders consisting of metallic and non-metallic phases have also been produced using mechanical cladding and chemical solution techniques. The chemical techniques include precipitation and sol-gel processes in which salts or gels containing the desired ions are produced. Composite powders can then be made by precipitating the product around the suspended particulate phase.

The precipitates produced from these methods often consist of refractory anions such as halides and sulfides or low melting nitrates. The removal of these refractory anions requires high temperature processing. Fine particles may be difficult to produce from nitrates due to melting and agglomeration or grain growth during processing. In addition, many of the salts contain unwanted cations such as $Na^+$ or $K^+$ which may also be difficult to remove.

A method recently developed at the Naval Research Laboratory produces a superconducting composite formed from $YBa_2Cu_3O_{7-x}$ (YBC) and silver (Ag). These YBC/Ag composites use Ag coated powders. This method utilizes a technique involving the dissolution of silver nitrate ($AgNO_3$) into an appropriate solvent. Superconducting powders are mixed into the solution wetting the surfaces of the powder particles. The solution is evaporated, causing the precipitation of $AgNO_3$ particulates onto the ceramic surface which are then melted and decomposed to form a metallic Ag coating. Because a continuous coating is formed, it is difficult to produce small discrete particles within the matrix as evidenced by the presence of Ag particles as large as 25 microns present in the samples.

Another technique has been reportedly used recently to make a soluble bismuth compound (bismuth 2-ethylhexanoate) for sol-gel synthesis of Bi-based superconducting compounds. An soluble Bi compound is produced by dissolving $Bi(NO_3)_3$ into an ammonia soap solution. The oily product is extracted with xylene and isolated by removing the solvent under vacuum. However, it is reported that when the product was mixed with other organic solvents in an attempt to produce intimately mixed precursors of the Bi—Ca—Sr—Cu—O superconducting compound, the resultant mixture failed to produce these desired precursors.

As seen from the foregoing, the known methods for producing advanced microcomposite materials or powders for superconducting applications all have unique shortcomings which severely limit their reliability and effectiveness and thus prevent them from being used in industrial and government applications on a regular and competitive basis. Consequently, a need exists for an improved method for producing advanced microcomposite materials or powders for superconducting applications which overcomes the shortcomings of these known methods.

SUMMARY OF THE INVENTION

The present invention is directed to a method for producing microcomposite material or powders for use in superconducting and non-superconducting applications designed to satisfy the aforementioned need. The present invention embodies a method for producing inorganic particles and particulate microcomposite powders from metallorganic precursors. The metallorganic precursor can be used to coat primary phase materials to form coated powders and substrates. When properly processed, the organic component of the metallorganic precursor in the coating decomposes leaving behind fine-grained inorganic particles. Sintered samples fabricated from processed powders formed by the method of the present invention exhibit uniformly dispersed, fine-grained particles throughout the matrix of the primary phase material. In particular, the present invention provides a method for dispersing inorganic particles such as metallic silver via an organic precursor, in solution within a superconducting primary phase material matrix, and can be used to produce organic and inorganic composites consisting of either metallic or non-metallic particulates on plastic, metallic or ceramic surfaces. These materials can be used, in turn, to engineer a wide range of composites such as plastic-matrix-composites (PMC's), a metal-matrix-composites (MMC's) and ceramic-matrix-composites (CMC's).

The method of the present invention may be varied for use in conjunction with other solution synthesis processes to create even more intimately mixed and homogeneously distributed composite powders. By controlling various processing parameters, such as viscosity, it may be possible to utilize the method of the present invention in a variety of fabrication processes such as fiber drawing, slip casting and tape casting.

In accordance with the present invention, there is provided a method for producing a microcomposite powder comprising the steps of: (a) preparing a solution consisting of ammonium hydroxide and an organic acid; (b) dissolving an appropriate amount of a soluble precussor in the solution including ammonium soap to form the first solution; (c) adding a primary phase material in particulate form to the first solution; (d) preparing a second solution formed from a mixture of a weak acid and an organic solvent such as an alkyl-mono-ether; (e) adding the second solution to the first solution to form a resultant mixture causing the solution to form a gel around the primary phase particles; (f) allowing the gelling process to proceed until a gel/precipitate is produced around the primary phase particles so as to produce a composite precussor that can be easily separated from the liquid media; (g) drying of the composite precursor powder separated from the liquid media; and (h) calcining the primary phase material/metallic precursor powder to convert the metallic precussor to a metallic phase and thereby form a primary phase material/metallic phase microcomposite powder wherein the metallic phase is substantially uniformly dispersed in the matrix of the primary phase material.

These and other features and advantages of the present invention will become apparent to those skilled in the art upon a reading of the following detailed description of the method of the present invention.

DESCRIPTION OF THE PREFERRED EMBODIMENTS

The method of the present invention utilizes chemical synthesis techniques to produce well-dispersed, fine-grained microcomposite powders particularly useful in superconducting applications. The method uses the ability of soaps, especially ammonia soap, to undergo an exchange reaction with other cations. The reactions carried out in this invention result in the formation of insoluble products which can then be treated to form a variety of metallic and non-metallic composite products. The insoluble products consist of the primary phase powder and the metallic precussor (gel/precipitate) coating. The rate of insoluble product formation is controlled by changes in the pH of the solution. By suspending an appropriate powder within the solution, the product can be made to coat the existing powder particles. Microcomposite powders produced using this method result in the creation of engineered composites rather than as components in a complex single phase material based on the simultaneous precipitation of a series of organic precursor components. As will be more fully described herein, YBC/Ag high-temperature ceramic superconducting microcomposite powders have been produced using this method. Solution chemistry can be controlled to produce a range of Ag-loaded microcomposite powders. Sintered pellets derived from these powders exhibit well-dispersed, fine-grained metallic Ag throughout the superconducting matrix.

In particular, microcomposite powders are produced via a metallorganic synthesis involving the formation and reactions of a miscible soap in an appropriate parent solvent or solvents. After an ammonium soap solution is prepared, inorganic metal salt is dissolved and mixed to form a desired metallorganic solution. This step is followed by the slow addition of an acidic solution to change the pH of the system. As a result, the metallorganic formed by the reaction of the metal salt and ammonium soap gel/precipitates from solution as either an isolated insoluble phase or on the surface of an appropriate suspended powder or substrate, forming a relatively uniform coating.

Subsequent thermal processing of the product results in the transformation of the metallorganic compound into very fine metallic or non-metallic particles depending on the processing parameters used. Microcomposite powders can be produced by controlling the rate of gelation/precipitation, causing a prescribed amount of particulates to become associated with each existing primary phase grain in the sample. Because of this intimate association, further mechanical processing of the material will not adversely affect the spatial relationship between the two components. Microcomposite powders prepared with this process can be ground and pressed into a desired shape and sintered.

To produce microcomposite powders utilizing the method of the present invention, a desired amount of an appropriate metallic salt, such as silver nitrate, is dissolved into a soap solution (solution A) consisting of an organic carboxylic acid, such as 2-ethylhexanoic acid, and a base, such as ammonium hydroxide ($NH_4OH$) in an aqueous or organic solvent such as 2-ethoxyethanol, which is also known as alkyl-mono-ether and sold under thee tradename ethyl cellosolve. A primary phase material, such as a single phase YBC superconducting powder, is then added to the solution while stirring.

A second solution (solution B) consisting of a mixture of a weak polyprotic acid, such as citric acid, and an aqueous organic solvent such as ethyl cellosolve, is added slowly to the above mixture while still stirring until the resultant mixture begins to gel and becomes opaque. As gelation occurs, the slurry thickens and in some instances hardens into agglomerated masses of coated powder. These powders can be easily filtered, dried and ground. The viscosity of the slurry may be controlled to allow the use of casting and fiber drawing techniques. Once the cast material has dried, the green body possesses good strength and plasticity. To make a dry powder, it is desirable to filter and dry the coated powder prior to grinding. The powders are rinsed with methanol and dried under vacuum. After drying, the coated powders contain a large volume percentage of a metallorganic compound.

Further heat treatments under controlled atmospheric conditions help determine the specific phase of the dispersed particles. For the production of dispersed secondary metallic Ag within a superconducting YBC matrix, the appropriate thermal conditions are from between 200 and over 900 degrees C. in an oxidizing atmosphere.

Example 1 below provides a specific example of how the method of the present invention may be practiced to produce a YBC/Ag superconducting microcomposite containing about 10 wt. pct. metallic Ag.

EXAMPLE 1

Prepare a first solution (solution A) containing:

19 ml of 2-ethylhexanoic acid and 16 ml of $NH_4OH$ (ammonium hydroxide) with 60 ml of ethyl cellosolve while continuously stirring slowly.

Add 6.8 g of $AgNO_3$ (20 wt. pct. silver nitrate to solution A while still stirring until completely dissolved.

Prepare a second solution (solution B) using 10 g of citric acid dissolved into 100 ml of ethyl cellosolve.

Slowly add 9 g of superconducting YBC powder to the solution A and mix thoroughly. Then slowly add the solution B to the mixture. When the resulting mixture begins to cloud and thicken, this indicates that the gel is precipitating around the YBC particles.

When the gel has completely precipitated from solution, the resultant slurry is rinsed with a solvent such as methanol, filtered and dried to produce a YBC/Ag precursor composite powder. Metallic Ag is produced by calcining the processed powder at around 500 degrees C. A sintered YBC/Ag microcomposite sample is produced by grinding and dry-pressing the processed powder to the desired shape followed by firing to above 850 degrees C. in oxygen for several hours. The sample is annealed in flowing oxygen for several additional hours between 400–700 degrees C. to produce a superconducting product.

The effects of processing on YBC powders were evaluated using a scanning electron microscope (SEM), optical microscopy, and X-ray diffraction (XRD) data. Although the depth of the coating is not known, tests have shown that the coating completely covers the irregular surfaces of the raw YBC powders, indicating good adhesion of the precipitated compound to the ceramic YBC powders. X-ray data collected from this sample shows only trace amounts of Ag, indicating its occurrence as either a very fine amorphous phase or as part of a complex Ag-metallorganic coating. The coating decomposes during calcining, resulting in the formation of very fine Ag particulates dispersed throughout the YBC powder. Energy Dispersive X-ray (EDS) analysis of the particles indicates the smaller particles are either A and/or YBC, while the larger particles are YBC. X-ray data from the calcined powders shows metallic Ag to be a major phase.

The extent of metal loading can be varied according to the initial quantity of $AgNO_3$ dissolved into the solution and the amount of YBC powder used. The amount of metallic Ag remaining in the processed powders was estimated by comparing the intensity of X-ray data collected from the Ag(111) plane using standards of known quantities of metallic Ag. Tests have indicated that up to about 40 wt. pct. Ag was deposited onto the processed powder surfaces.

Pellets made from coated powders were fired in flowing oxygen at 900 degrees C. for 12 hours and annealed for an additional 12 hours at 500 degrees C. Each pellet was submitted to a simple test designed to detect the Meissner effect based on the response of the samples to a permanent rare earth ceramic magnet. The tests were performed at a liquid nitrogen temperature of 77 degrees K. All the samples were found to be superconducting (i.e.-displayed a Meissner effect), except the 60 wt. pct. loaded pellet, although XRD indicated the majority of the non-metallic phase present in the 60 wt. pct. pellet was orthorhombic (superconducting) YBC.

The ratio of the alkyl-mono-ether to organic acid and base in solution A and the concentration of the weak acid solution (solution B) can vary significantly. Such variations, however, may adversely affect the loading efficiency as well as the viscosity and uniformity of resulting coated powders.

The following experiments, on which examples 2 through 5 were based, were carried out by taking aliquots from larger batches of the primary solutions. In particular, the solutions for all of the examples 2 through 5 consisted of the following:

Solution A 36 ml of 2-ethylhexanoic acid 32 ml of ammonium hydroxide 112 ml of ethyl cellosolve 12.8 g of $AgNO_3$.

Stir gently at room temperature until the nitrate dissolves.

Solution B1 (10 wt. pct. citric acid solution)

300 ml of ethyl cellosolve 30 g of citric acid

Apply low heat and stir until the solution is clear.

Solution B2 (5 wt. pct. citric acid solution)

100 ml of ethyl cellosolve 5 g of citric acid Apply low heat and stir until the solution is clear EXAMPLE 2 (20 wt. pct. metallic Aq)

Thoroughly mix 9 g of superconducting YBC powder with 40 ml of solution A at room temperature. Slowly add 100 ml of solution B1 and continue mixing.

EXAMPLE 3 (40 wt. pct. metallic Ag)

Thoroughly mix 6.8 g of superconducting YBC powder with 60 ml of solution A at room temperature. Slowly add 100 ml of solution B1 and continue mixing.

EXAMPLE 4 (60 wt. pct. metallic Ag)

Thoroughly mix 6.0 g of superconducting YBC powder with 80 ml of solution A at room temperature. Slowly add 100 ml of solution B1 and continue mixing. As previously described, once gelation occurs the slurry thickens and tends to agglomerate into masses of coated powder. The powders can be filtered, dried and ground.

Similar results can be obtained by varying the concentration of the weak acid in solution B (as shown in solution B2, above) prior to mixing with solution A.

EXAMPLE 5 (20 wt. pct. metallic Ag using 5 wt. pct. citric acid solution)

Thoroughly mix 9 g of superconducting YBC powder with 40 ml of solution A at room temperature. Slowly add 100 ml of solution B2 and continue mixing. When the reaction is complete, the final product is filtered, dried and processed as before.

The same process described above can be carried out using inorganic precursor powders. For this and all related methods, the intended composite component should be inert with respect to the primary phase or its constitutive phases. Separate powder samples of $Si_3N_4$, $Al_2O_3$ and graphite (C) were successfully processed utilizing both Ag and Cu-soap solutions to produce microcomposite powders. The methods were similar to those presented above with the exception of the composition of the dispersed powders which were mixed into the soap solutions, and the compositions of the metallic soap solution into which the powders were mixed prior to precipitation of the metallorganic coating material.

Other possible embodiments of the method of the present invention may involve the use of either gold or platinum-group compounds. Such compounds, dissolved into an appropriate solution and capable of precipitating out as an organic gel could be used for coating other oxide or non-oxide ceramic particles. In addition, materials made using this method could be suitable for the production of catalyst compounds.

It is thought that the present invention and many of its attendant advantages will be understood from the foregoing description and it will be apparent that various changes may be made in the form of the invention described herein without departing from the spirit and scope of the invention or sacrificing all of its material advantages, the forms hereinbefore described being merely preferred or exemplary embodiments thereof

We claim:

1. A method for producing a microcomposite powder, comprising the steps of:

(a) preparing a first solution consisting of an organic solvent and an ammonium soap prepared by reacting an ammonium hydroxide with a carboxylic acid;

(b) adding an inorganic silver salt to said first solution to form a metallorganic precursor thereby producing a resultant solution;

(c) suspending a ceramic material in particle form in said resultant solution while stirring;

(d) adding a second solution consisting of a weak polyprotic acid and an organic solvent to said resultant solution while stirring to form a resultant mixture;

(e) allowing said resultant mixture to set until said resultant mixture gels and precipitates around particles of said ceramic material in said resultant mixture;

(f) thereafter filtering, rinsing and drying said resultant mixture to produce a silver precursor having ceramic material particles embedded in a silver gel/precipitate; and (g) calcining said silver precursor to convert said silver gel/precipitate to a metallic phase and thereby forming a microcomposite powder containing ceramic material particles coated with a metallic phase.

2. The method for producing a microcomposite powder as recited in claim 1, wherein said resultant mixture is rinsed with methanol and dried under vacuum.

3. The method for producing a microcomposite powder as recited in claim 1, wherein said metallorganic precursor is silver 2-ethylhexanoate.

4. The method for producing a microcomposite powder as recited in claim 1, wherein said calcining step (g) is performed at between 200 and 900 degrees C in an oxidizing atmosphere.

5. The method for producing a microcomposite powder as recited in claim 4, wherein said calcining step (g) is performed at approximately 500 degrees C.

6. The method for producing a microcomposite powder as recited in claim 1, wherein said silver salt is silver nitrate and said ceramic material is a single phase YBC superconducting powder.

7. The method for producing a microcomposite powder as recited in claim 1, wherein said carboxylic acid is 2-ethylhexanoic acid.

8. The method for producing a microcomposite powder as recited in claim 1, wherein said organic solvent is 2-ethoxyethanol.

9. The method for producing a microcomposite powder as recited in claim 8, wherein said said weak polyprotic acid is citric acid.

* * * * *